United States Patent [19]
Izumi et al.

[11] Patent Number: 6,069,374
[45] Date of Patent: *May 30, 2000

[54] CCD TYPE SOLID STATE IMAGING DEVICE

[75] Inventors: Akio Izumi; Yasuhiko Naito; Atsushi Kobayashi; Tomio Ishigami; Shinji Nakagawa, all of Kanagawa; Takeshi Tamugi, Kagoshima, all of Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/937,932

[22] Filed: Sep. 25, 1997

Related U.S. Application Data

[63] Continuation of application No. 08/508,241, Jul. 27, 1995, abandoned, which is a continuation of application No. 08/200,460, Feb. 23, 1994, abandoned.

[30] Foreign Application Priority Data

Feb. 23, 1993 [JP] Japan ..................................... 5-057745

[51] Int. Cl.$^7$ ......................... H01L 27/148; H01L 29/768
[52] U.S. Cl. .......................................... 257/250; 257/233
[58] Field of Search .................................. 257/232, 233, 257/249, 250

[56] References Cited

U.S. PATENT DOCUMENTS

| | | |
|---|---|---|
| 4,518,978 | 5/1985 | Takeshita . |
| 4,589,005 | 5/1986 | Matsuda et al. ........................ 257/250 |
| 4,602,289 | 7/1986 | Sekine ..................................... 257/233 |
| 4,935,794 | 6/1990 | Miyatake . |
| 5,237,191 | 8/1993 | Yonemoto et al. ..................... 257/250 |
| 5,306,906 | 4/1994 | Aoki et al. .............................. 257/232 |

FOREIGN PATENT DOCUMENTS

| | | |
|---|---|---|
| 60 257 574 | 5/1986 | Japan . |
| 02 159 063 | 9/1990 | Japan . |

OTHER PUBLICATIONS

Patent Abstract of Japan, vol. 18, No. 144, Mar. 10, 1994 & JP 05 326914 A (Matsushita Electron Corp.), Dec. 10, 1993.

Primary Examiner—Gene M. Munson
Attorney, Agent, or Firm—Hill & Simpson

[57] ABSTRACT

A CCD type solid state imaging device including a plurality of vertically arranged light receiving elements, a plurality of vertical charge transfer electrodes associated with the light receiving elements and transfer channels through which signal electrical charges stored in the light receiving elements are readout and transferred in the charge transfer direction by the transfer electrodes. The present invention features that unlike the conventional CCD type solid state imaging device, the boundary line between at least a part of the vertical charge transfer electrodes and a part of the vertical charge transfer electrodes adjacent thereto is held aslant with respect to the transfer channels so that the vertical transfer efficiency of the device is increased without incurring a reduction in the amount of signal charges being handled and the readout of the signal charges stored in the light receiving elements to the transfer channels is performed more smoothly than the conventional device.

9 Claims, 5 Drawing Sheets

CCD TYPE SOLID STATE IMAGING DEVICE

This is a continuation of application Ser. No. 08/508,241, filed Jul. 27, 1995 now abandoned, which is a continuation of Ser. No. 08/200,460 filed Feb. 23, 1994 now abandoned.

BACKGROUND OF THE INVENTION

1. Field of the Invention

The present invention relates to a CCD type solid state imaging device and more particularly, to a novel CCD type solid state imaging device which is capable of improving the vertical charge transfer efficiency and the efficiency of reading out signal charges from the light receiving elements to the transfer channels.

2. Description of the Related Art

The conventional CCD type solid state imaging device has vertical charge transfer electrodes arranged such that the orientation of the boundary lines among multilayer vertical charge transfer electrodes lying over the transfer channels is normal to the charge transfer direction. In other words, the vertical transfer electrodes of the CCD imaging device represent, as a whole, a shape which would be formed by a plurality of rectangles if they were shifted parallelly so as to partially overlap one another with the horizontal sides of each of the vertical charge electrodes running normal to the transfer direction as will be described in detail later.

However, in view of the fact that it is considered necessary for a CCD type solid state imaging device to have a higher charge transfer efficiency, an attempt has been made to improve the charge transfer efficiency in such a manner that a shallow barrier of an oblique pattern is formed by selectively implanting impurities in the transfer channels thereby meeting such demand but this method is not desirable since it reduces the amount of electrical charges being handled, in proportion to the area of the barrier.

SUMMARY OF THE INVENTION

The present invention has been made to solve the above-described problem and an object of the invention is to provide a CCD type solid state imaging device which is capable of improving the vertical charge transfer efficiency without reducing the amount of signal charges being handled and which enables the signal readout from the light receiving elements to the transfer channels to be performed smoothly.

The first aspect of the present invention resides in that the boundary line between at least a part of the adjoining vertical transfer electrodes is so oriented that when viewed from above, either the edge of the boundary line intersecting the side of each of the transfer channels on the side of the light receiving element associated with the electrodes or the edge of the boundary line intersecting the side of that transfer channel on the side opposite the light receiving element is biased toward the transfer direction with respect to the other edge.

Consequently, the transfer field strength in the case of applying the same voltage on the vertical transfer electrodes becomes larger than that in the case of the conventional device due to the horizontal two-dimensional contour effect and the potential gradient along the transfer direction under the vertical transfer electrodes can be made larger, to thereby improve the vertical charge transfer efficiency.

The second aspect of the present invention resides in that the boundary line between the vertical transfer electrode which reads out a signal charge from the light receiving element associated therewith to the transfer channel related thereto, and the vertical transfer electrode adjacent the former electrode is so oriented that when viewed from above, the edge of the boundary line intersecting the side of the related transfer channel on the side opposite the light receiving element is biased toward the transfer direction with respect to the edge of the boundary line intersecting the side of the transfer channel lying on the side of the light receiving element.

Consequently, in addition to the effect of improving the vertical charge transfer efficiency as achieved by the imaging device according to the first aspect of the present invention, the reading out of signal charges from the light receiving element by the vertical transfer electrode associated with that element to the related transfer channel can be performed smoothly.

BRIEF DESCRIPTION OF THE DRAWINGS

FIGS. 1A, 1B and 1C show an example of a conventional CCD type solid state imaging device of which FIG. 1A is a plan view of the same, FIG. 1B is a sectional view of an electrode structure of the device when taken along the B—B line of FIG. 1A and FIG. 1C is a potential profile taken along the B—B line of FIG. 1A.

FIGS. 2A, 2B and 2C show one embodiment of a CCD type solid state imaging device according to the present invention of which FIG. 2A is a plan view of the same, FIG. 2B is a sectional view of an electrode structure of the same when taken along the B—B line of FIG. 2A and FIG. 2C is a diagram showing a potential profile taken along the B—B line of FIG. 2A;

PREFERRED EMBODIMENTS OF THE INVENTION

Figure 1A:
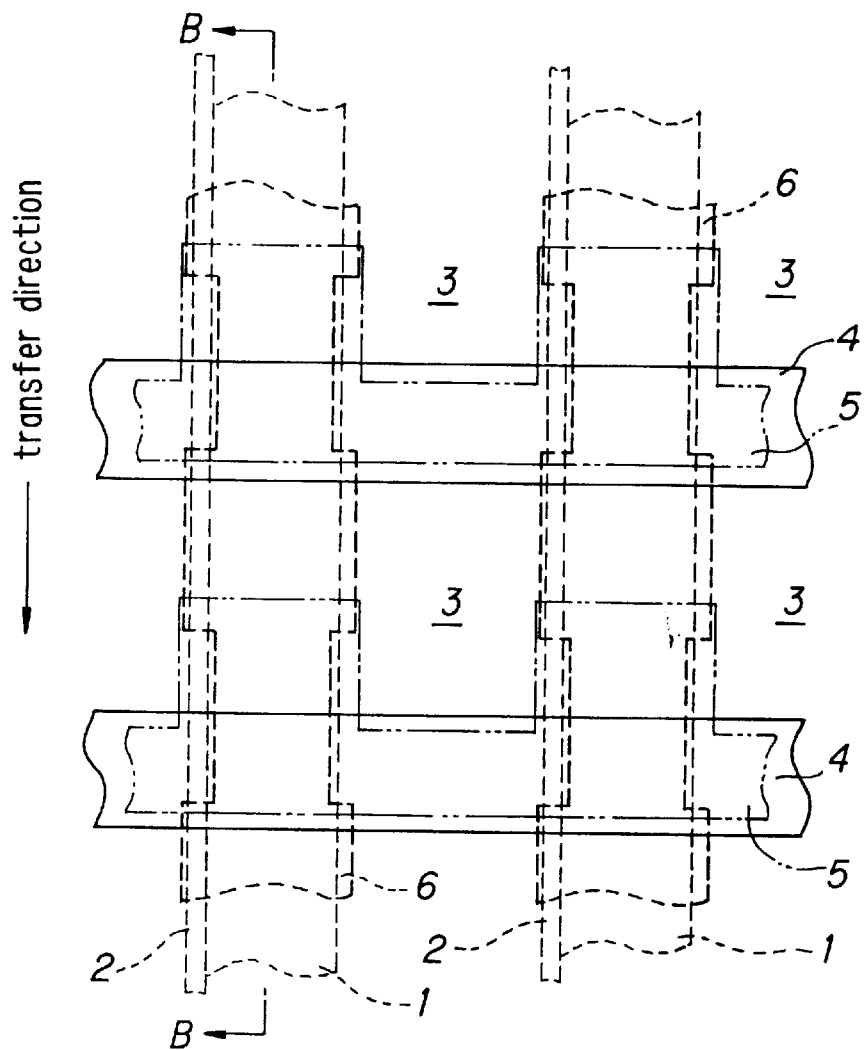

Prior to describing preferred embodiments of the present invention, a conventional CCD type solid state imaging device will be described with reference to FIGS. 1A, 1B and 1C. As shown in these figures, a conventional CCD type solid state imaging device includes transfer channels 1, channel stoppers 2, light receiving elements 3, a vertical charge transfer electrode 4 comprising a first polysilicon layer (1 Poly), a vertical charge transfer electrode 5 comprising a second polysilicon layer (2 Poly) and a vertical charge transfer electrode 6 comprising a third polysilicon layer (3 Poly). The electrodes 4, 5 and 6 are basically arranged according to a vertical stripe pattern.

As will be understood from FIG. 1A, the orientation of the portions of the boundary line between the multilayer-vertical charge transfer electrodes lying over the transfer channels has been such that it runs normal to the charge transfer direction as already mentioned. That is, the boundary line between the vertical charge transfer electrodes is normal to the transfer direction.

Figure 1B:
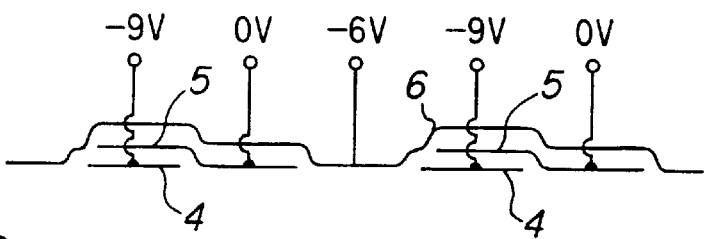

FIG. 1B shows an electrode structure in section when taken along B—B line of FIG. 1A. From this figure it will be seen that the potential of the (1 poly) vertical charge transfer electrode 4 is −9 V, the potential of the vertical charge transfer electrode 5 is 0 V and the potential of the (3 poly) vertical charge transfer electrode 6 is −6 V.

Figure 1C:
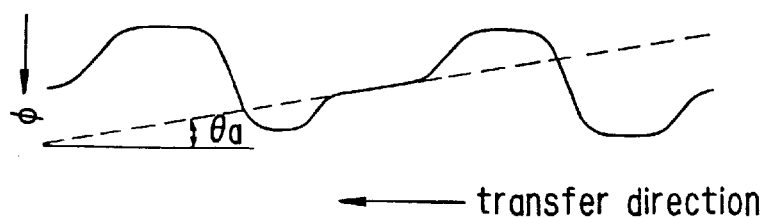

FIG. 1C shows a potential profile at the time of transferring a signal charge from under the (3 poly) electrode 6 to under the (2 poly) electrode 5 in the potential conditions as shown in FIG. 1B. In this figure, the broken line designates a potential gradient (an angle of θ) at the portion below the (3 poly) vertical charge transfer electrode 6 (i.e. the portion where the (1 poly) and (2 poly) vertical charge transfer electrodes 4 and 5 are absent).

A CCD type solid state imaging device according to one embodiment of the present invention will now be described in detail with reference to FIGS. 2A through 2C. In these figures, reference numeral 21 designates a transfer channel, reference numeral 22 designates a channel stopper, reference numeral 23 designates a light receiving element, reference numeral 24 designates a vertical transfer electrode comprising a first polysilicon layer, reference numeral 25 designates a vertical transfer electrode comprising a second polysilicon layer and reference numeral 26 designates a vertical transfer electrode comprising a third polysilicon layer. These elements are basically arranged according to a vertical stripe pattern.

The difference between the CCD type solid state imaging device of the present invention and the conventional one resides in that the boundary line of the adjoining vertical transfer electrodes is formed such that when viewed from above, either one of an edge a of the boundary line intersecting the side of the transfer channel 21 on the light receiving element side or an edge b thereof intersecting the side of the transfer channel 21 on the side opposite the light receiving element 23 is biased toward the transfer direction with respect to the other, and in the instant embodiment, the edge b is biased toward the transfer direction with respect to the edge a.

Figure 2A:
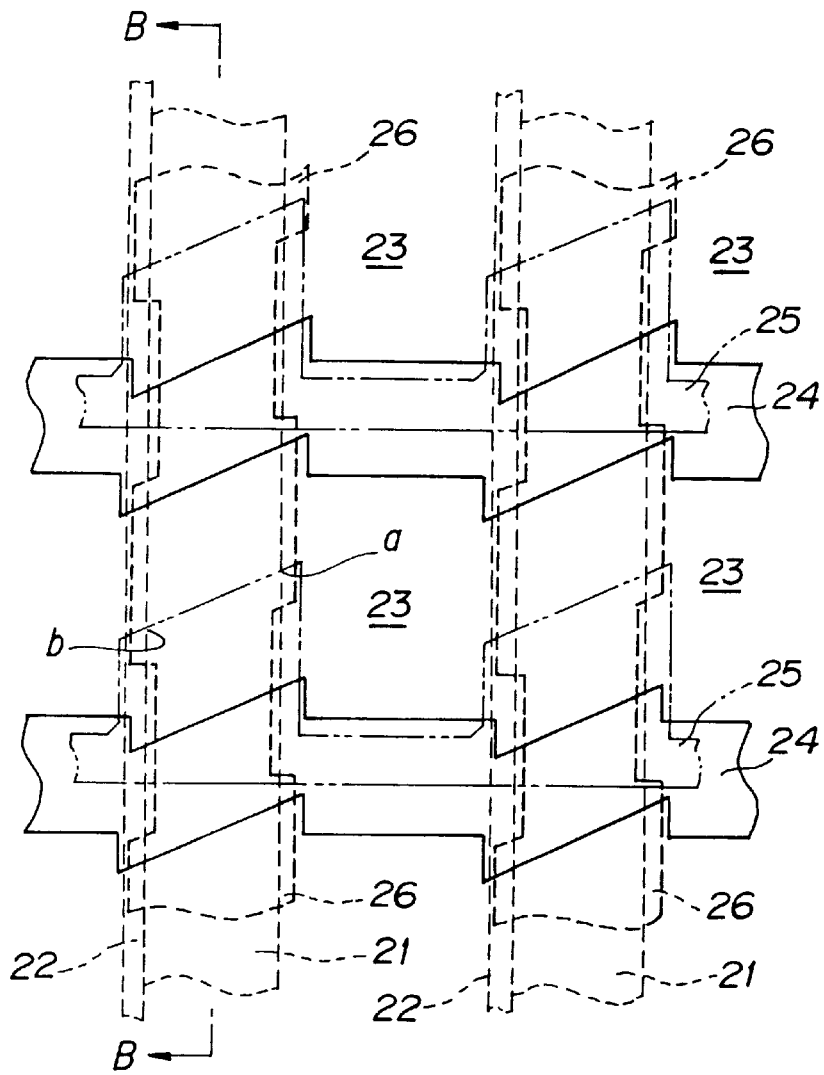
Figure 2B:
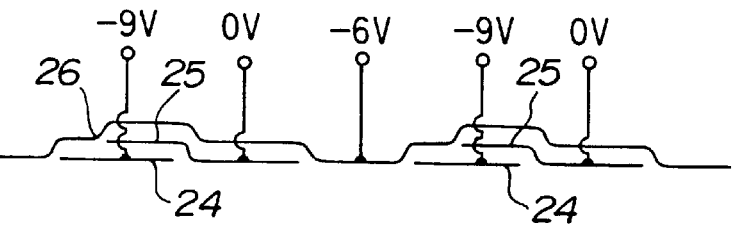
Figure 2C:
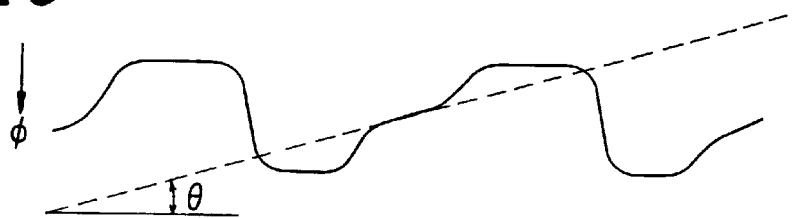

Thus, with the above arrangement, the potential profile in the course of transfer of a signal charge from the third layer polysilicon vertical transfer electrode 26 to the second layer polysilicon vertical transfer electrode 25 will be as shown in FIG. 2C wherein the broken line designates the minimum field strength distribution gradient (angle θ) under the vertical transfer electrode 26. This gradient is sharper than that which is obtained with the conventional CCD type solid state imaging device shown in FIGS. 1A to 1C. Further, as shown in FIG. 3 and the table I below, the transfer field [mV/μm] when the same voltage (i.e. V3 [V]) is applied upon the third layer vertical transfer electrode 26 is generally stronger than that in the case of the conventional device.

Figure 3:
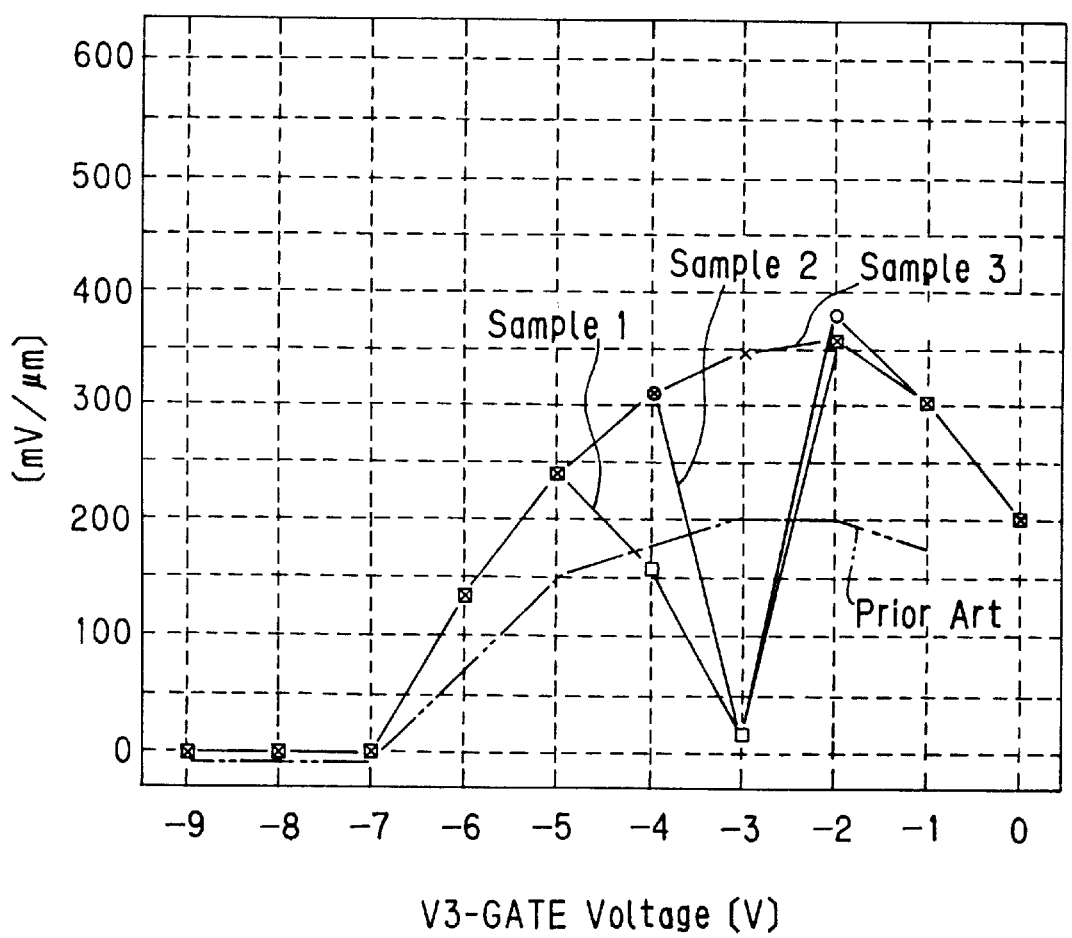
FIG. 3 is a graph showing relationships between the voltage to be applied upon vertical charge transfer electrodes included in the CCD type solid state imaging device of the present invention and the field strength under the vertical charge transfer electrodes.

By the way, FIG. 3 shows relationships between the gate voltage applied on the third layer vertical transfer electrodes of both the conventional device and the instant embodiment and the transfer field strengths under such vertical transfer electrodes wherein the solid lines designate a plurality of cases according to the instant embodiment and the two-dot chain line designates a case according to the conventional device. Further, the following table I illustrates a number of cases in both the instant embodiment and the conventional device of relationships between the gate voltage applied on the vertical transfer electrodes and the transfer field strengths occurring under the vertical transfer electrodes.

Thus, since the edge b of the boundary line between the adjoining vertical transfer electrodes intersecting the side of the transfer channel lying on the side opposite the light receiving element associated with the electrodes is biased toward the transfer direction with respect to the edge a of the boundary line intersecting the side of the transfer channel facing the light receiving element, the direction in which the signal charges are read out from the light receiving element to the transfer channel becomes aslant when viewed from above, thereby smoothing the charge readout operation.

TABLE 1

Table of results for these Embodiments compared with Prior Art

| Voltage V3 [V] | | | −9.0 | −8.0 | −7.0 | −6.0 | −5.0 | −4.0 | −3.0 | −2.0 | −1.0 | 0.0 |
|---|---|---|---|---|---|---|---|---|---|---|---|---|
| Prior Art Example | | Transfer field [mV/m] | 0.0 | 0.0 | 0.0 | 68.95 | 145.0 | 175.7 | 201.3 | 202.3 | 169.5 | |
| Present Example | EF3 | Transfer field [mV/m] | 0.0 | 0.0 | 0.0 | 140.2 | 240.8 | 311.8 | 13.14 | 355.7 | 298.5 | 200.3 |
| | EF3-1 | Transfer field [mV/m] | 0.0 | 0.0 | 0.0 | 134.6 | 240.8 | 158.5 | 13.14 | 376.9 | 298.5 | 200.3 |
| | EF3-2 | Transfer field [mV/m] | 0.0 | 0.0 | 0.0 | 134.6 | 240.8 | 158.5 | 13.14 | 355.7 | 298.5 | 200.3 |
| | EF3-3 | Transfer field [mV/m] | 0.0 | 0.0 | 0.0 | 140.2 | 240.8 | 311.8 | 346.2 | 355.7 | 298.5 | 200.3 |
| | EF3-4 | Transfer field [mV/m] | 0.0 | 0.0 | 0.0 | 134.6 | 240.8 | 158.5 | 13.14 | 355.7 | 298.5 | 200.3 |
| | EF3-5 | Transfer field [mV/m] | 0.0 | 0.0 | 0.0 | 134.5 | 240.8 | 158.5 | 13.14 | 355.7 | 298.5 | 200.3 |

Figure 4:
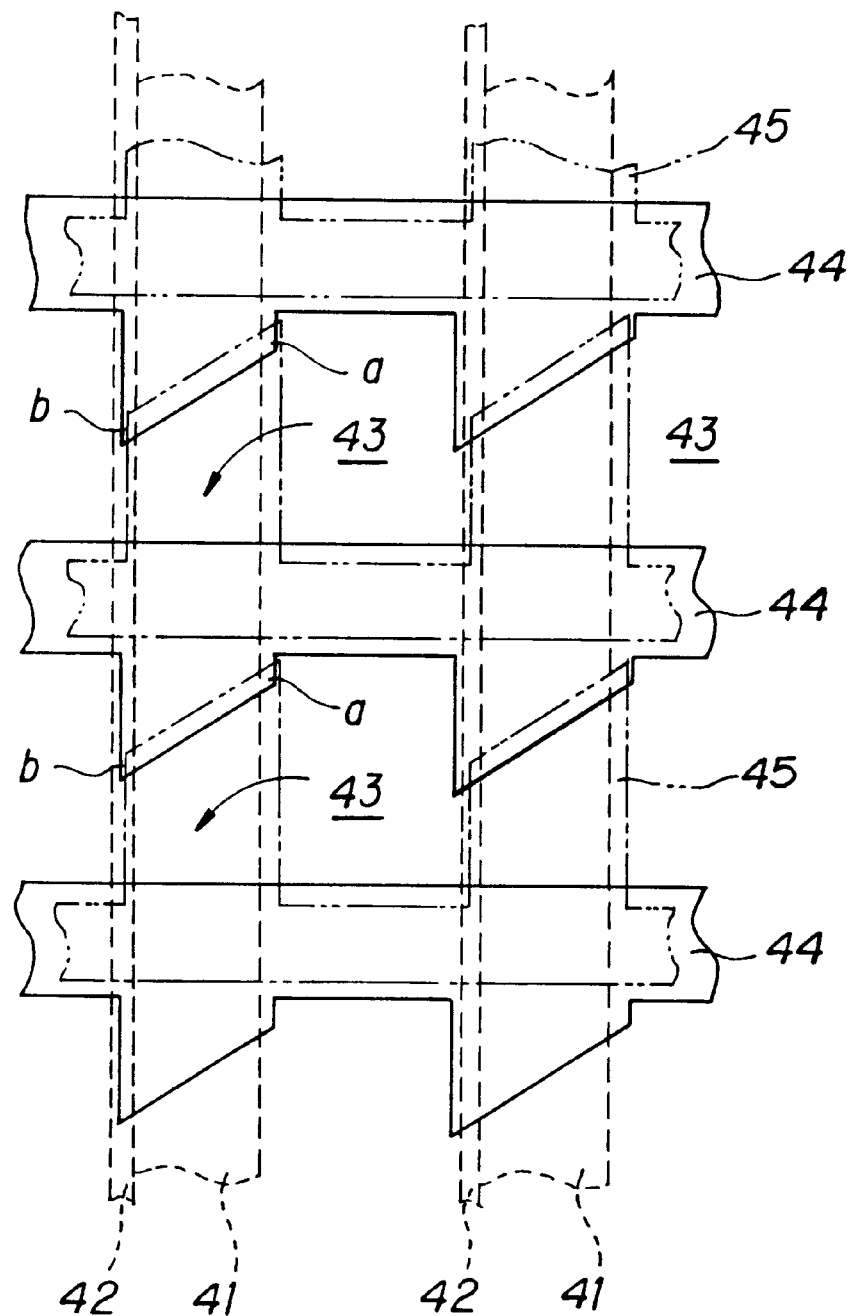
FIG. 4 is a plan view of another embodiment of the CCD type solid state imaging device according to the present invention.

FIG. 4 shows a CCD type solid state imaging device according to another embodiment of the present invention. This embodiment is a result of application of the present invention to a CCD type solid state imaging device provided with vertical charge transfer registers according to the second layer polysilicon four-phase drive system.

In this embodiment, as in the case of FIGS. 2A to 2C embodiment, the edge b of the boundary line of the (1 poly) vertical charge transfer electrode 44 and the (2 poly) vertical charge transfer electrode 45 on the side opposite the light receiving element 43 (i.e., on the side of the channel stopper 42) is biased toward the transfer direction with respect to the edge a of the boundary line on the side of the light receiving element 43 when viewed from above, so that the electrical field strength under the vertical charge transfer electrode 44 with respect to the same applying voltage and the vertical charge transfer efficiency can be increased.

Further, as a result of the above arrangement, the direction in which the signal charges are read out from the light receiving elements 43 to the transfer channels 41 by the vertical charge transfer electrode 45 becomes aslant so that the readout operation can be performed more smoothly than otherwise, as in the case of the FIGS. 2A to 2C embodiment.

Figure 5:
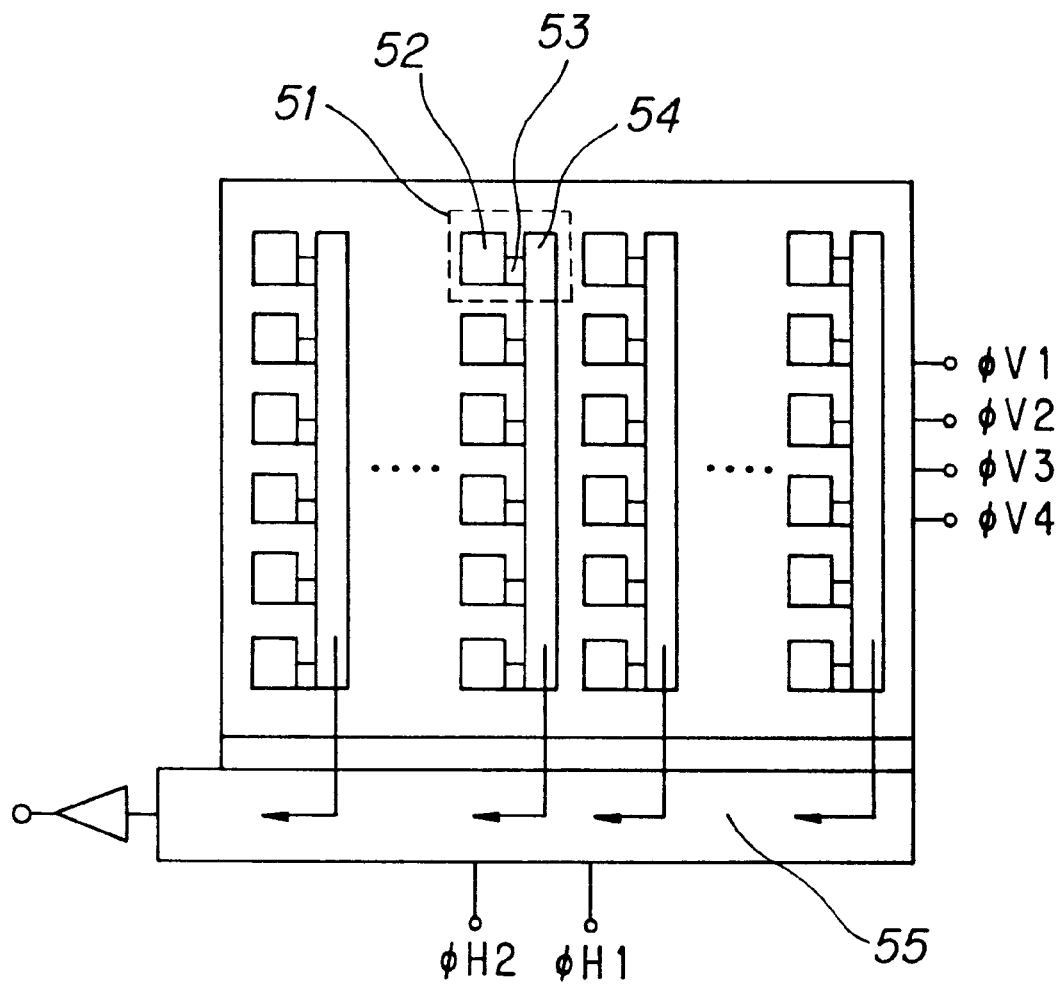
FIG. 5 is a diagram showing the structure of an interline CCD type image sensor to which the present invention is applied.

In addition, the present invention can also be used to provide an interline transfer system CCD image sensor whose structure is shown in FIG. 5. As shown, This image sensor comprises rows of vertically arranged photodiodes 52 forming light receiving portions and rows of horizontally arranged vertical CCD registers 54 both of which elements 52 and 54 are arranged horizontally in an alternative fashion. The area enclosed by the broken line designates a unit pixel 51 and photoelectric conversion is performed by a photodiode 52 in the region thereby storing signal charges. That is, signal charges generate from each photodiode 52 due to the emission of light so as to be stored. Then the stored signal charges are read out on a vertical transfer portion 54 formed by a CCD group through a gate portion 53 and are transferred in sequence to a horizontal transfer portion 55 by the charge transfer operation of the vertical charge transfer portion 54. The signal charges are then transferred to an output portion during a period corresponding to each horizontal video period enabling an imaging output to appear at the signal output terminal. The device of such a system is disclosed, for example, in U.S. Pat. No. 4,518,978 and U.S. Pat. No. 4,935,794. When the present invention is applied to the above-mentioned vertical transfer portion 54, an interline transfer CCD image sensor having an improved vertical transfer efficiency and an improved signal charge readout efficiency from the light receiving elements to the transfer channels can be obtained.

Although the present invention has been described with respect to its preferred embodiments, it should be noted that the present invention is not always limited thereto and various changes and modifications may be made within the spirit and scope of the invention as described in the specification and as defined by the appended claims.

What is claimed is:

1. A CCD solid state imaging device comprising:
   a plurality of light receiving elements;
   a linear vertical charge transfer channel for transferring signal charges stored in the light receiving elements, said linear vertical charge transfer channel having a first charge transfer electrode and a second charge transfer electrode adjacent to the first charge transfer electrode, a boundary line between the first charge transfer electrode and the second charge transfer electrode being oriented such that when viewed from above, a first edge of said boundary line intersects a side of the transfer channel and is biased toward a signal charge transfer direction with respect to a second edge of said boundary line, said first and second charge transfer electrodes being comprised of three layers and driven with three phase pulses.

2. A CCD type solid state imaging device comprising:
   a light receiving portion having a plurality of light receiving elements; and
   a charge transfer portion arranged adjacent to said light receiving portion for transferring signal charges stored in the light receiving portion through a transfer channel in a first direction;
   said charge transfer portion having a first charge transfer electrode and a second charge transfer electrode adjacent to the first charge transfer electrode, said first charge transfer electrode and said second charge transfer electrode crossing said transfer channel in a second direction perpendicular to said first direction, wherein a boundary line of at least a protruding part of said first charge transfer electrode and a protruding part of said second charge transfer electrode adjacent thereto is inclined with respect to said first direction and oriented such that when viewed from above, one of the edges of said boundary line which both intersect respective sides of each said transfer channel is biased toward said first direction with respect to said other edge of said boundary line; wherein said first and second charge transfer electrodes are driven by four-phase pulses, and a channel stopper is only provided on the side of said charge transfer portion opposite to said light receiving portion.

3. A CCD type solid state imaging device comprising:
   a light receiving portion having a plurality of light receiving elements; and
   a charge transfer portion arranged adjacent to said light receiving portion for transferring signal charges stored in the light receiving portion through a transfer channel in a first direction;
   said charge transfer portion having at least a first charge transfer electrode and a second charge transfer electrode, said first charge transfer electrode and a said second charge transfer electrode crossing said transfer channel in a second direction perpendicular to said first direction;
   wherein a boundary line of at least a protruding part of said second charge transfer electrode adjacent thereto is inclined with respect to said first direction and oriented such that when viewed from above, one of the edges of said boundary line which both intersect respective sides of each said transfer channel is biased toward said first direction with respect to said other edge of said boundary line;
   wherein a third charge transfer electrode extends in said first direction over said transfer channel and protruding parts of said first and second charge transfer electrodes.

4. A CCD type solid state imaging device according to claim 3, wherein a first edge of said boundary line is biased toward the signal charge transfer direction with respect to a second edge of said boundary line.

5. A CCD type solid state imaging device according to claim 3, wherein said at least one first transfer electrode is adapted to read out said signal charges from said light receiving elements associated therewith to said transfer channel.

6. A CCD type solid state imaging device according to claim 3, wherein a channel stopper is provided on the side of a second edge of said boundary line between said first and second charge transfer electrode.

7. A CCD type solid state imaging device according to claim 3, which comprises:
   a plurality of vertical rows of said light receiving elements;
   a plurality of vertical charge transfer portions which are arranged horizontally in an alternative fashion with respect to said rows of light receiving elements so as to become respectively associated therewith, at least a part of said vertical charge transfer portions having a structure identical with said charge transfer portions;
   a plurality of readout gate portions formed between said light receiving portions and said vertical charge transfer portions, respectively;
   a horizontal charge transfer portion connected to said vertical charge transfer portions; and
   a plurality of output portions connected to said horizontal charge transfer portions.

8. A CCD type solid state imaging device according to claim 7, wherein said readout gate portions serve as said first charge transfer electrodes.

9. A CCD type solid state imaging device according to claim 8, wherein a first edge of said boundary line between said charge transfer electrodes is biased toward said charge transfer direction with respect to a second edge of said boundary line.

* * * * *